United States Patent
Nakao et al.

(10) Patent No.: US 6,437,668 B1
(45) Date of Patent: Aug. 20, 2002

(54) SURFACE ACOUSTIC WAVE RESONATOR, SURFACE ACOUSTIC WAVE DEVICE, AND COMMUNICATION DEVICE USING SHEAR HORIZONTAL WAVES

(75) Inventors: Takeshi Nakao, Nagaokakyo; Toshimaro Yoneda, Ishikawa-ken; Koji Fujimoto, Otsu; Michio Kadota, Kyoto, all of (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/557,805

(22) Filed: Apr. 25, 2000

(30) Foreign Application Priority Data

May 7, 1999 (JP) .......................................... 11-127387

(51) Int. Cl.[7] ............................. H03H 9/25; H03H 9/64; H03H 9/72
(52) U.S. Cl. ...................... 333/193; 333/133; 333/195; 310/313 B; 310/313 D; 310/361; 310/363
(58) Field of Search ................................ 333/193–196, 333/133; 310/313 R, 313 A, 313 B, 313 C, 313 D, 360, 361, 363; 29/25.35

(56) References Cited

U.S. PATENT DOCUMENTS

| | | | |
|---|---|---|---|
| 5,432,392 A | | 7/1995 | Kadota et al. .......... 310/313 A |
| 5,814,917 A | * | 9/1998 | Isobe et al. ............. 310/313 B |
| 5,838,217 A | * | 11/1998 | Kadota et al. ............... 333/193 |
| 5,847,486 A | * | 12/1998 | Kadota et al. .......... 310/313 R |
| 5,952,899 A | * | 9/1999 | Kadota et al. .......... 333/133 X |
| 5,953,433 A | * | 9/1999 | Fujimoto et al. ....... 310/313 R |
| 6,088,462 A | * | 7/2000 | Fujimoto et al. ....... 310/313 R |
| 6,127,769 A | * | 10/2000 | Kadota et al. .......... 310/313 B |
| 6,150,900 A | * | 11/2000 | Kadota et al. .......... 333/193 X |
| 6,154,105 A | * | 11/2000 | Fujimoto et al. ........... 333/194 |
| 6,218,763 B1 | * | 4/2001 | Fujimoto et al. ....... 310/313 A |

FOREIGN PATENT DOCUMENTS

| | | | |
|---|---|---|---|
| EP | 0860943 | | 8/1998 |
| EP | 0 936 733 | | 8/1999 |
| JP | 5-183376 | * | 7/1993 .................. 333/193 |
| JP | 6-164286 | * | 6/1994 .................. 29/25.35 |
| JP | 6-164306 | * | 6/1994 .............. 310/313 A |
| JP | 10-247835 | * | 9/1998 |

* cited by examiner

*Primary Examiner*—Robert Pascal
*Assistant Examiner*—Barbara Simmons
(74) *Attorney, Agent, or Firm*—Keating & Bennett, LLP (57) ABSTRACT

A surface acoustic wave resonator includes a piezoelectric substrate and an interdigital transducer disposed on the piezoelectric substrate and made of a metal or an alloy having a higher specific weight than that of the piezoelectric material of the piezoelectric substrate so as to generate shear horizontal waves. The interdigital transducer includes a plurality of electrode fingers. A ratio of the electrode finger width relative to the electrode finger width plus the space between adjacent electrode fingers is about 0.55 to about 0.85.

18 Claims, 8 Drawing Sheets

SURFACE ACOUSTIC WAVE RESONATOR, SURFACE ACOUSTIC WAVE DEVICE, AND COMMUNICATION DEVICE USING SHEAR HORIZONTAL WAVES

BACKGROUND OF THE INVENTION

1. Field of the Invention

The present invention relates to a surface acoustic wave resonator, a surface acoustic wave device, such as a filter or combined device, including the resonator, and a communication device including the resonator. More specifically, the present invention relates to a surface acoustic wave resonator using SH (Shear Horizontal) waves, a surface acoustic wave device such as a surface acoustic wave filter or a combined device, and a communication device.

2. Description of the Related Art

Surface acoustic wave devices have been widely used for band-pass filters in mobile radio communication apparatuses. Various types of surface acoustic wave devices are commercially produced for various applications. Among such surface acoustic wave devices, an SH type surface acoustic wave device including a quartz substrate and an interdigital transducer (IDT) made of Ta, W or Au is disclosed in, for example, EP0860943A2.

A method of manufacturing such a surface acoustic wave device will be described with reference to the sequential steps thereof.

Figure 9A:
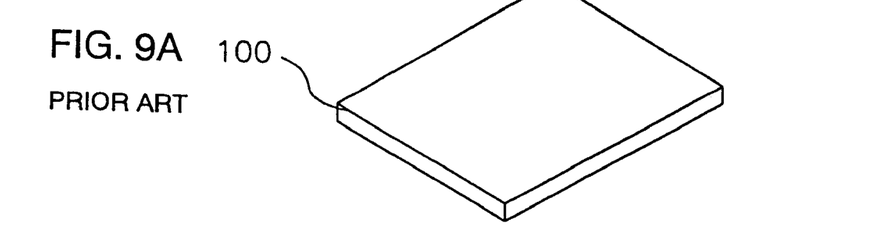
FIGS. 9A–9E are flow diagrams showing a manufacturing method for a surface acoustic wave device.
Figure 9B:
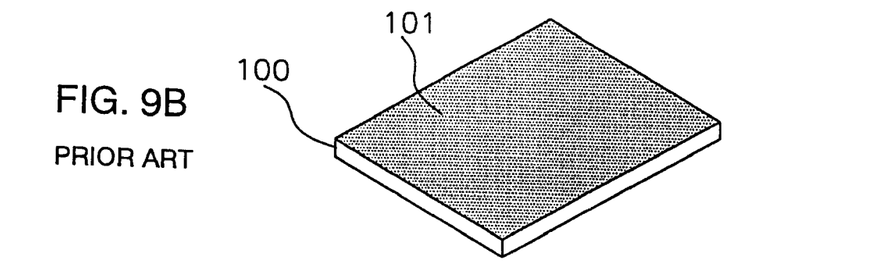
Figure 9C:
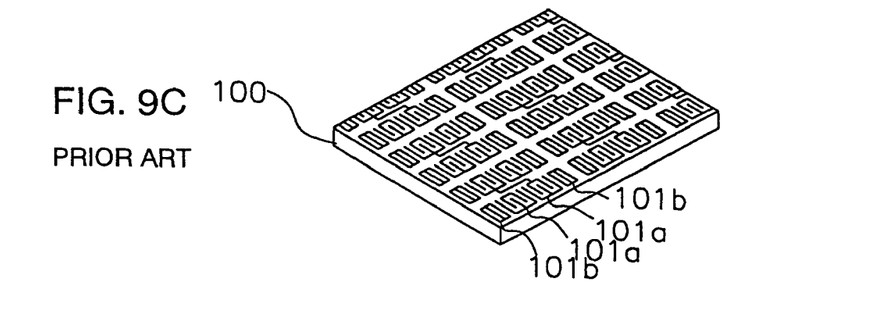
Figure 9D:
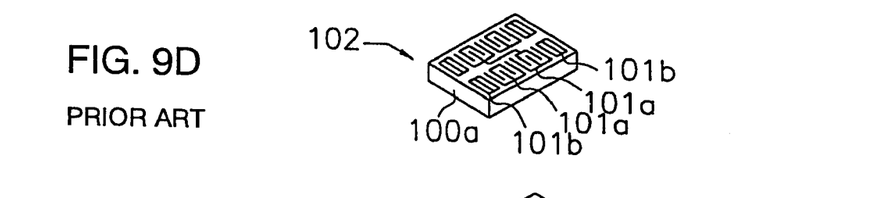
Figure 9E:
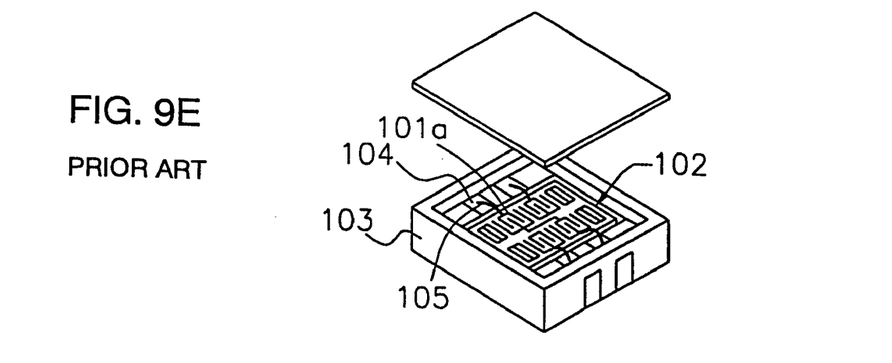

First, a wafer 100 made of quartz is prepared as shown in FIG. 9A. A metal thin film 101 made of Ta is formed on the top surface of the wafer 100 by vapor deposition, sputtering, or other process, as shown in FIG. 9B. Unnecessary portions of the metallic thin film 101 are then removed by etching to form a plurality of patterns including a plurality of IDTs 101a and a plurality of reflectors 101b, as shown in FIG. 9C. As shown in FIG. 9D, a combination of IDTs 101a and reflectors 101b defining one surface acoustic wave element 102 is cut off by cutting of portions of the wafer 100 where any portion of IDTs 101a and reflectors 101b is not formed. The divided surface acoustic wave element 102 is provided and contained in a package 103 to connect an electrode 104 of the package 103 to the IDTs 101a electrically via bonding wire 105, as shown in FIG. 9E.

As described above, on a piezoelectric substrate made of quartz, a metallic film is formed by evaporating or sputtering a metal having a large mass load such as Ta, W, and Au, and then an electrode finger for defining the IDT of the surface acoustic wave device is formed by producing patterns of the metallic film by a method such as photo-etching. The resonance frequency of the surface acoustic wave device is primarily determined by the space between electrode fingers defining the IDT, the film thickness, and the width of the electrode fingers.

When the surface acoustic wave device is manufactured by the above-mentioned processes, the width of the electrode fingers and the film thicknesses are different or varied at every single wafer due to the lack of accuracy in the control of process parameters. These variations cause variations in frequency of the surface acoustic wave devices generated therein.

The inventors of the invention described and claimed in the present application discovered that, when the IDT is formed of a metal having a large density such as Ta, W, and Au, the IDT experiences a very serious problem with large variations in frequency due to variations in the width of the electrode fingers and the film thicknesses. More specifically, when the IDT is formed of Al which is common in general surface acoustic wave devices, frequency deviations are so small that the frequency deviations can be adjusted after the IDTs are formed. On the other hand, when the IDT is formed of a metal having a large density such as Ta, W, and Au, the frequency deviations are so great that the deviations cannot be adjusted after formation of the IDT. This is because a frequency dependence on a volume of the IDT becomes great in response to the density of material for the IDT. Thus, the frequency deviations becomes very large even if the variations in thickness or a width of the IDT are the same as the variations occurring with an IDT made of Al.

SUMMARY OF THE INVENTION

In order to overcome the problems described above, preferred embodiments of the present invention provide a surface acoustic wave resonator and a surface acoustic wave device which have a very small frequency deviation relative to a designed value regardless of the variations in the width of the electrode fingers and the film thicknesses.

According to one preferred embodiment of the present invention, a surface acoustic wave resonator includes a piezoelectric substrate and an IDT disposed on the piezoelectric substrate and made of a metal or an alloy having a higher specific weight than that of the piezoelectric material of the piezoelectric substrate so as to excite SH waves, wherein a ratio relating to an electrode finger defining the IDT, more specifically, a ratio of the electrode finger width relative to the sum of the electrode finger width and a space between adjacent electrode fingers, is from about 0.55 to about 0.85.

With this unique structure and arrangement, a speed of sound conductance of SH wave-type surface acoustic waves becomes blunt in sensitivity to the electrode finger width of the IDT.

The piezoelectric substrate is preferably a quartz substrate having Euler angles of approximately (0°, 121° to 136°, and 87° to 93°).

With this unique structure and arrangement, a surface acoustic wave resonator having a large electromechanical coefficient and excellent temperature characteristics is achieved.

A surface acoustic wave resonator may further include reflectors disposed on both sides of the IDT so as to sandwich the IDT therebetween. In such an arrangement, a ratio the electrode finger width relative to the sum of the electrode finger width and the space between adjacent electrode fingers, is preferably from about 0.55 to about 0.85.

With these features, a speed of sound conductance of SH wave-type surface acoustic waves becomes blunt in sensitivity to the electrode finger width of the IDT.

The surface acoustic wave resonator may be applied to a surface acoustic wave device or a communication device.

As a result of the unique structure and arrangement described above, a surface acoustic wave device or a communication device in which insertion losses in a pass band are greatly improved and variations in frequency are greatly reduced is achieved.

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

Hereinafter, preferred embodiments of the present invention are explained in detail with reference to the drawings.

Figure 1:
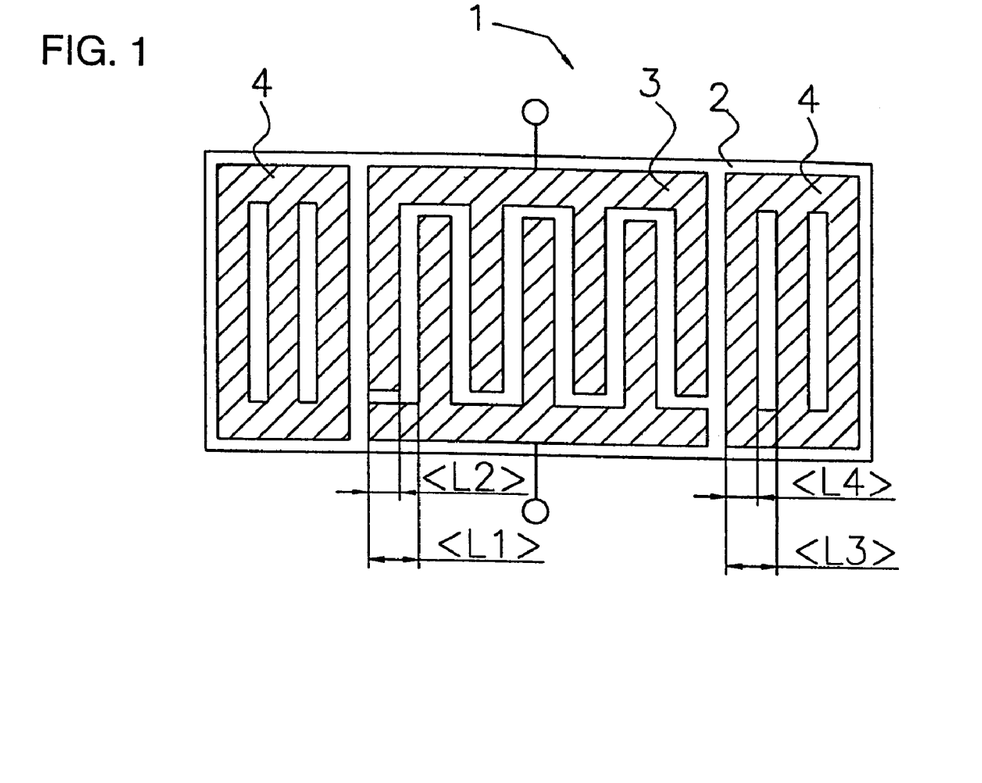
FIG. 1 is a plan view of a surface acoustic wave resonator according to a first preferred embodiment of the present invention.

FIG. 1 is a plan view of a surface acoustic wave resonator according to a first preferred embodiment of the present invention.

As shown in FIG. 1, a surface acoustic wave resonator 1 preferably includes a piezoelectric substrate 2 preferably made of crystal, at least one IDT 3 disposed on the piezoelectric substrate 2, and at least two reflectors 4 disposed on both sides of the IDT 3.

The IDT 3 is preferably made of an electrode material containing Ta as the principal ingredient and preferably includes a set of interdigital electrodes arranged such that comb-tooth portions of each electrode oppose each other.

An electrode finger defining a comb-tooth portion of the IDT 3 is established such that the width of the electrode finger is larger than the space between adjacent electrode fingers of the IDT 3. That is, the range of the ratio of the electrode finger width "L2" relative to the sum of the electrode finger width and the space between adjacent electrode fingers "L1" is preferably about 0.55 to about 0.85. The width of the electrode finger is also preferably larger than the space between electrode fingers of the reflector 4. That is, the range of the ratio of the electrode finger width "L4" relative to the sum of the electrode finger width and the space between electrode fingers "L3" is preferably about 0.55 to about 0.85.

Figure 2:
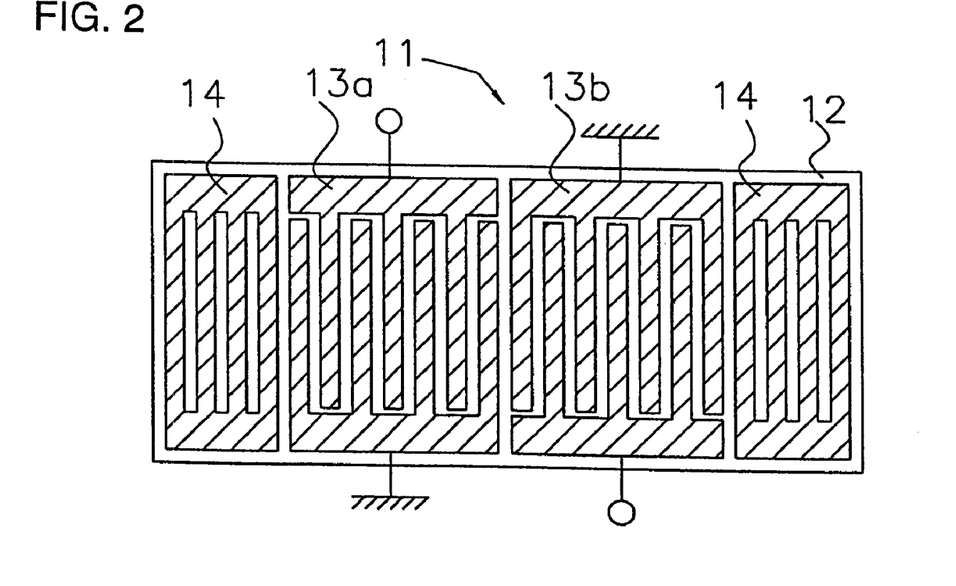
FIG. 2 is a plan view of a longitudinally-coupled type surface acoustic wave filter according to a second preferred embodiment of the present invention.

Next, a second preferred embodiment according to the present invention will be described. FIG. 2 is a plan view of a longitudinally-coupled type surface acoustic wave filter according to the second preferred embodiment of the present invention.

As shown in FIG. 2, the longitudinally-coupled type surface acoustic wave filter 11 preferably includes a piezoelectric substrate 12 made of crystal, at least two IDTs 13a and 13b disposed on the piezoelectric substrate 12, and reflectors 14 located on both sides of the IDTs 13a and 13b.

The IDTs 13a, 13b are preferably formed of an electrode material containing Ta as the principal ingredient and preferably include a set of interdigital electrodes arranged such that comb-tooth portions of each electrode oppose each other. The IDTs 13a and 13b are arranged substantially parallel to each other and separated by a predetermined space in the propagation direction of the surface acoustic wave. As with the first preferred embodiment, also in this second preferred embodiment, the width of the electrode finger is larger than the space between adjacent electrode fingers of the IDTs 13a and 13b. That is, the range of the ratio of the electrode finger width relative to the sum of the electrode finger width and the space between electrode fingers is about 0.55 to about 0.85. The width of the electrode finger is also larger than the space between electrode fingers of the reflectors 14. That is, for the reflectors 14, the range of the ratio of the electrode finger width relative to the sum of the electrode finger width and the space between electrode fingers about 0.55 to about 0.85.

Figure 3:
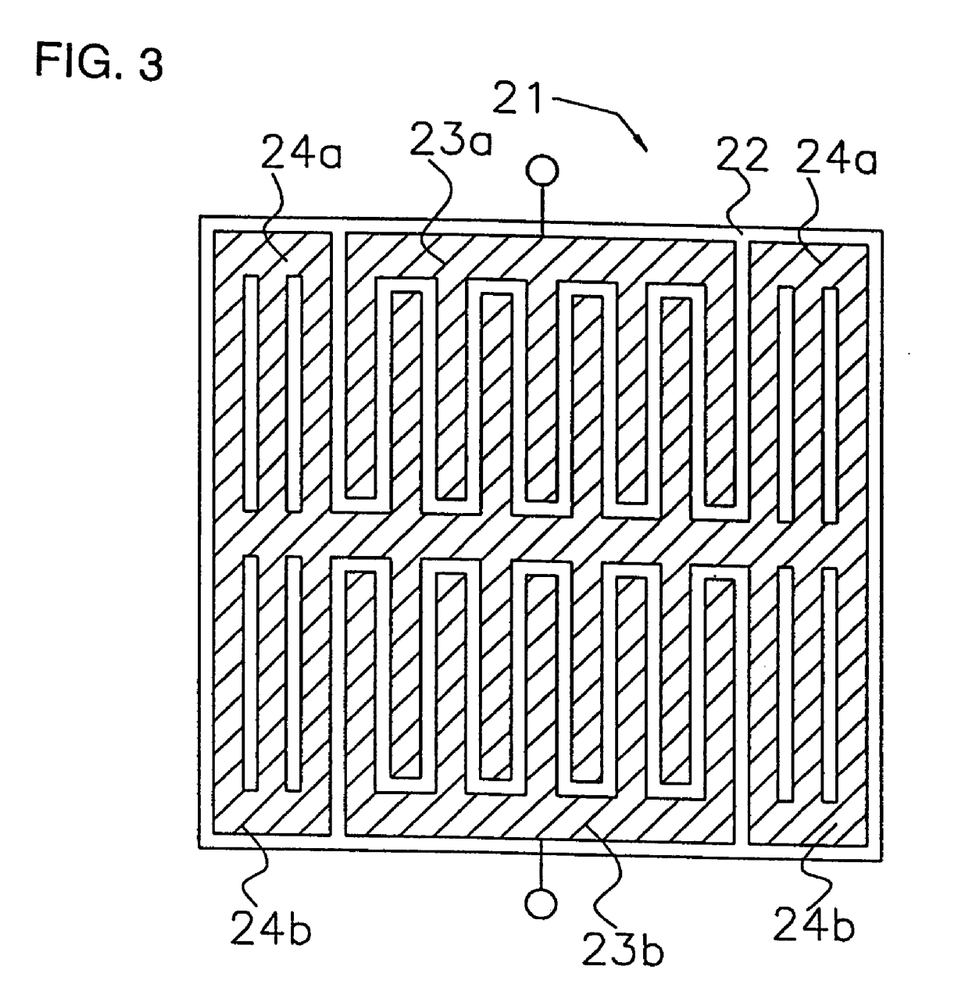
FIG. 3 is a plan view of a laterally-coupled-type surface acoustic wave filter according to a third preferred embodiment of the present invention.

Then a third preferred embodiment according to the present invention will be described. FIG. 3 is a plan view of a laterally-coupled type surface acoustic wave filter according to the third preferred embodiment of the present invention.

As shown in FIG. 3, the laterally-coupled type surface acoustic wave filter 21 preferably includes a piezoelectric substrate 22 made of crystal, at least two IDTs 23a and 23b disposed on the piezoelectric substrate 22, and reflectors 24a and 24b located on both sides of the IDTs 23a and 23b.

The IDTs 23a and 23b are preferably made of an electrode material containing Ta as the principal ingredient-and preferably include a set of interdigital electrodes arranged such that comb-tooth portions of each electrode oppose each other. The IDTs 23a and 23b are preferably arranged substantially perpendicular to the propagation direction of the surface acoustic wave. As with the first and the second preferred embodiments, also in this third preferred embodiment, the width of electrode finger is larger than the space between adjacent electrode fingers of the IDTs 23a and 23b. That is, the range of the ratio of the electrode finger width relative to the sum of the electrode finger width and the space between electrode fingers is about 0.55 to about 0.85. The width of the electrode finger is also larger than the space between electrode fingers of the reflectors 24a and 24b. That is, for the reflectors 24a and 24b, the range of the ratio of the electrode finger width relative to the sum of the electrode finger width and the space between electrode fingers is about 0.55 to about 0.85.

Figure 4:
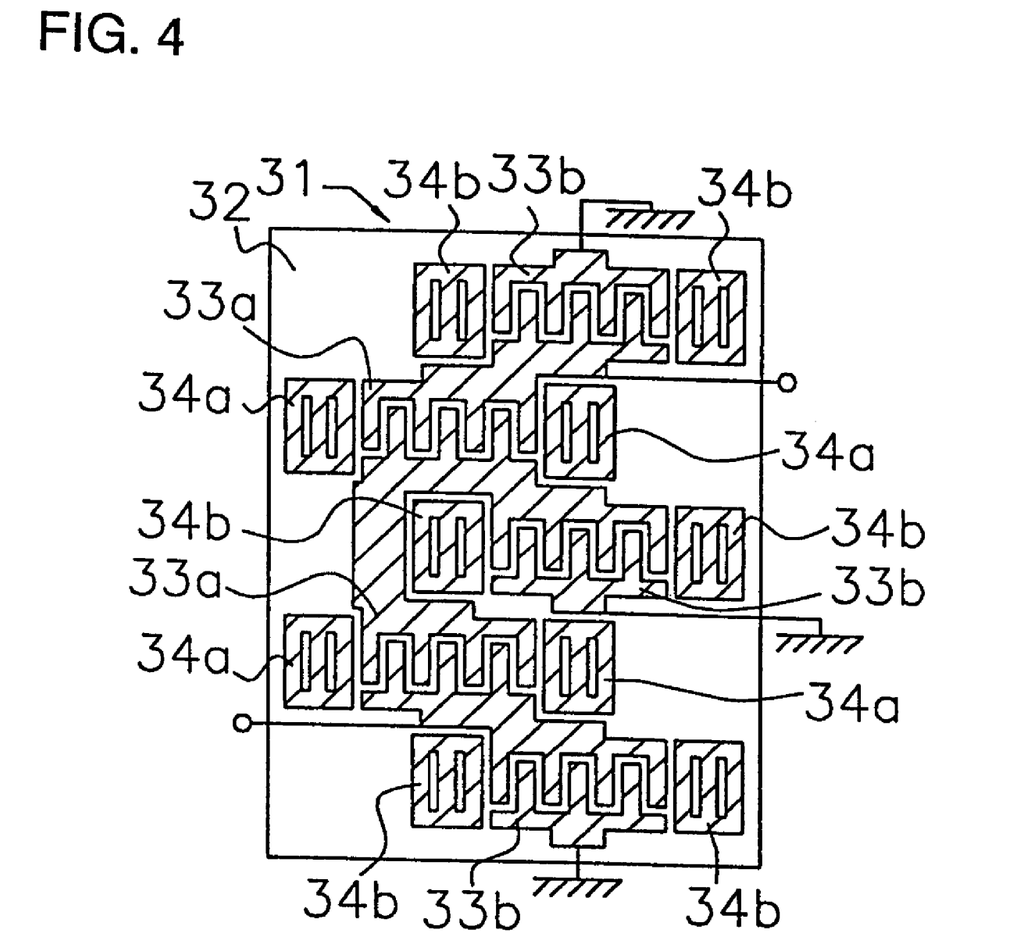
FIG. 4 is a plan view of a ladder-type surface acoustic wave filter according to a fourth preferred embodiment of the present invention.

Then a fourth preferred embodiment according to the present invention will be described. FIG. 4 is a plan view of a ladder-type surface acoustic wave filter according to the fourth preferred embodiment of the present invention.

As shown in FIG. 4, the ladder-type surface acoustic wave filter 31 preferably includes a piezoelectric substrate 32 made of crystal, at least two IDTs 33a and 33b disposed on the piezoelectric substrate 32, and reflectors 34a and 34b located on both sides of the IDTs 33a and 33b.

The IDTs 33a and 33b are preferably made of an electrode material containing Ta as the principal ingredient and preferably include a set of interdigital electrodes arranged such that comb-tooth portions of each electrode oppose each other. The IDT 33a is arranged in a series line while the IDT 33b is arranged in a parallel line to define a ladder-type arrangement. Like the first and the second preferred embodiments, also in this preferred embodiment, the width of electrode finger is larger than the space between adjacent electrode fingers of the IDTs 33a and 33b. That is, the range of the ratio of the electrode finger width relative to the sum of the electrode finger width and the space between adjacent electrode fingers is about 0.55 to about 0.85. The width of electrode finger is also larger than the space between adjacent electrode fingers of the reflectors 34a and 34b. That is, for the reflectors 34a and 34b, the range of the ratio of the electrode finger width relative to the sum of the electrode finger width and the space between adjacent electrode fingers is about 0.55 to about 0.85.

Figure 5:
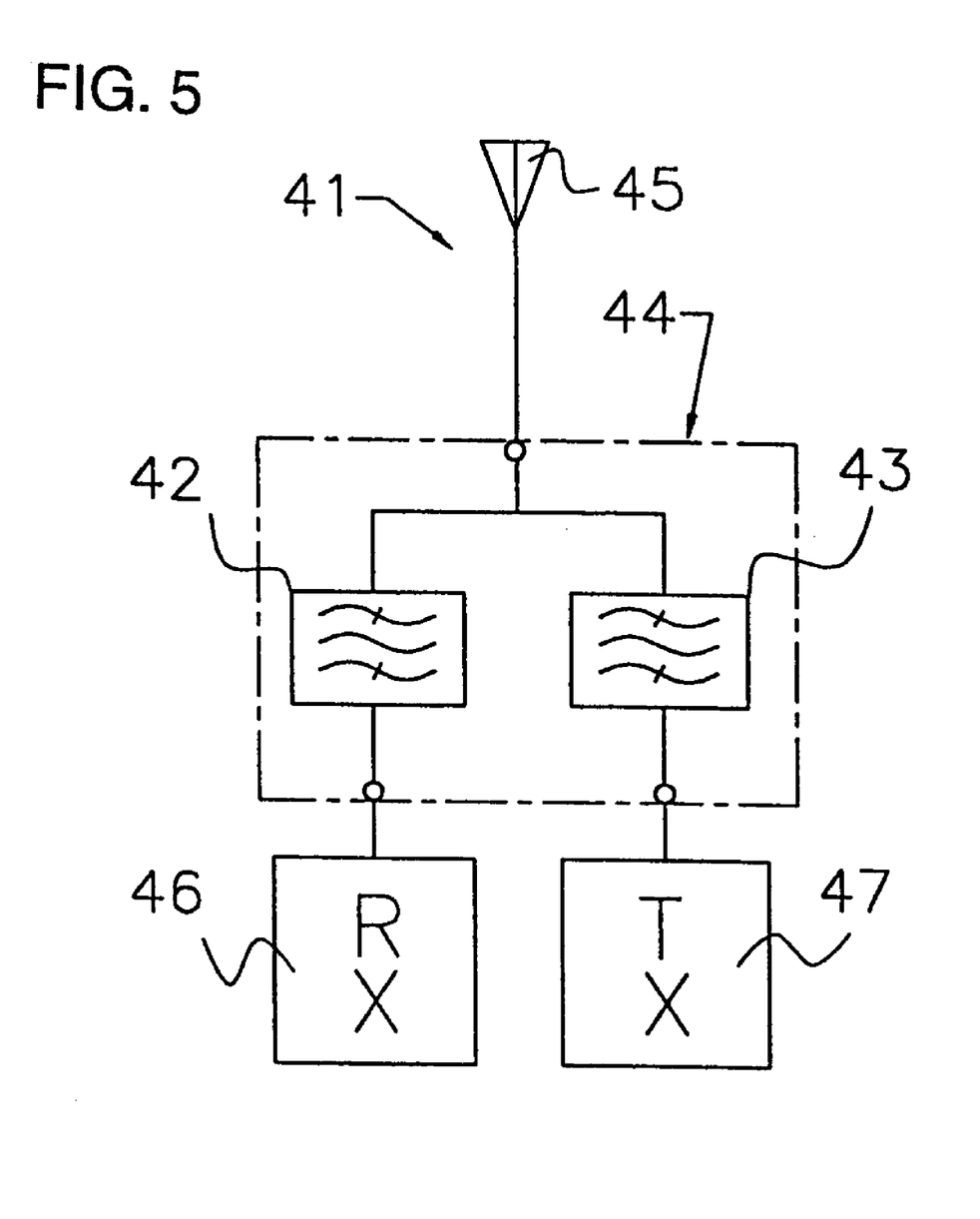
FIG. 5 is a block diagram of a combined device and a communication device according to a fifth and sixth preferred embodiment of the present invention.

Next, a fifth preferred embodiment and a sixth preferred embodiment according to the present invention will be described. FIG. 5 is a block diagram of a combined device according to the fifth preferred embodiment of the present invention and a communication device according to the sixth preferred embodiment of the present invention.

As shown in FIG. 5, a communication device 41 preferably includes a combined device 44 having a receiving surface acoustic wave filter 42 and a transmitting surface acoustic wave filter 43, an antenna 45, a receiving circuit 46, and a transmitting circuit 47, wherein an antenna terminal, an output terminal, and an input terminal of the combined device 44 are respectively connected to the antenna 45, the receiving circuit 46, and the transmitting circuit 47. As the receiving surface acoustic wave filter 42 and the transmitting surface acoustic wave filter 43 of such the combined device 44, any one or a combination of the surface acoustic wave filters 11 to 21 according to the second to the fourth preferred embodiments may be used.

Next, the range of the ratio of the electrode finger width relative to the sum of the electrode finger width and the space between adjacent electrode fingers is about 0.55 to about 0.85 according to preferred embodiments of the present invention will be described with reference to an example of one preferred embodiment of the present invention.

Figure 6:
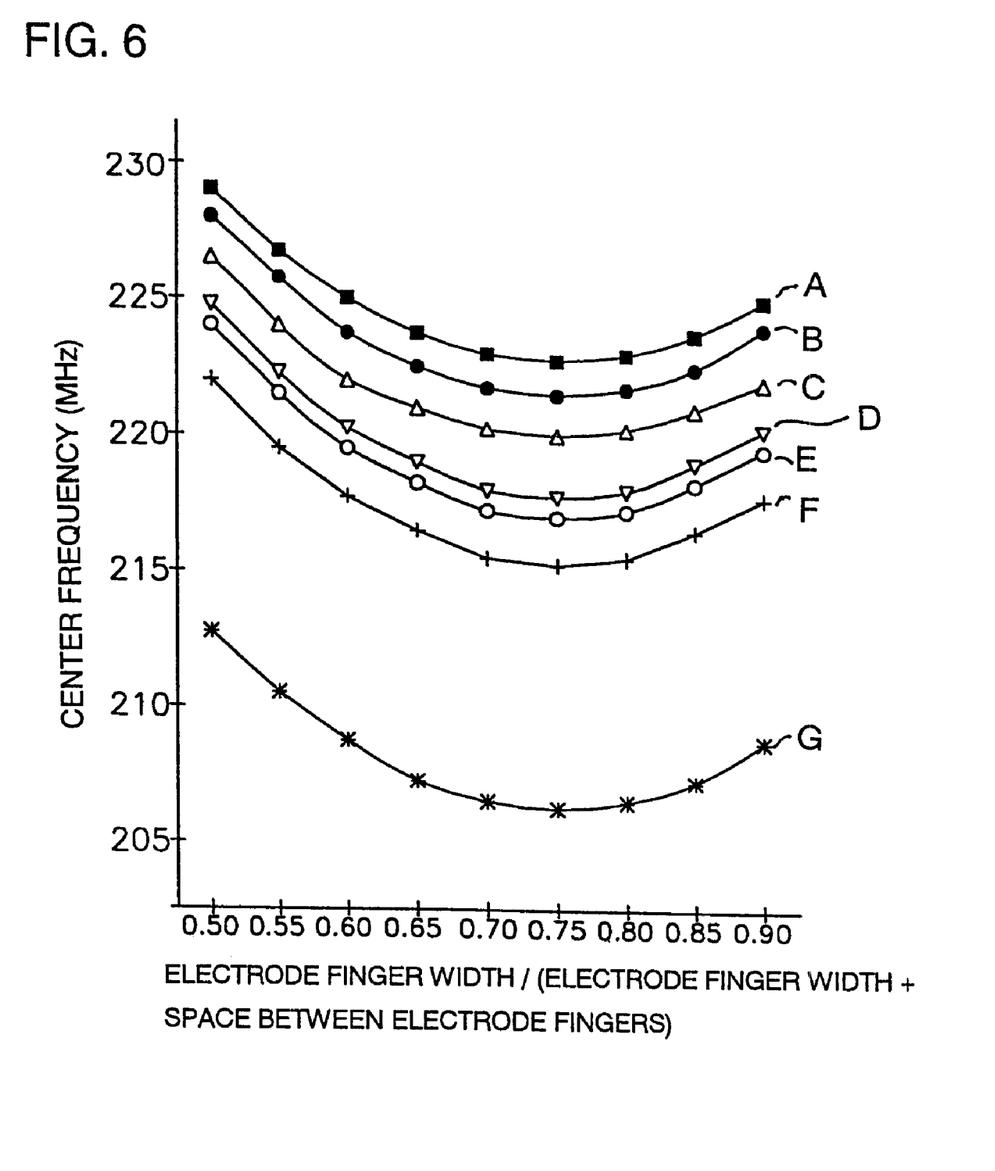
FIG. 6 is a graph showing changes in the center frequency relative to the ratio of the electrode finger width relative to the sum of the electrode finger width and the space between electrode fingers.

FIG. 6 is a graph showing variations in a center frequency when the ratio of the electrode finger width relative to the sum of the electrode finger width and the space between electrode fingers is changed from about 0.50 to about 0.90, wherein values of the normalized film thickness (thickness "d"/wave length "λ") are as follows, Curve A: 2.00%, Curve B: 2.04%, Curve C: 2.08%, Curve D: 2.12%, Curve E: 2.16%, Curve F: 2.20%, and Curve G: 2.47%. In this example of a preferred embodiment of the present invention, a longitudinally-coupled type surface acoustic wave filter using SH-type surface acoustic waves is used, and includes a quartz substrate having Euler angles of approximately (0°, 127°, and 90°), and two IDTs and reflectors disposed on the quartz substrate and made of a Ta electrode material. Only in the case of Curve E: 2.16%, a longitudinally-coupled type surface acoustic wave filter generating SH-type surface acoustic waves is used, and-includes a quartz substrate having Euler angles (0°, 126°, and 90°) and two IDTs and reflectors disposed on the quartz substrate and made of a Ta electrode material.

As shown in FIG. 6, the center frequencies define a downward arc having its apex at the value for the ratio of the electrode finger width relative to the sum of the electrode finger width and the space between electrode fingers of about 0.75. Therefore, it is understood that when the value of the ratio of the electrode finger width relative to the sum of the electrode finger width and the space between electrode fingers is about 0.75, variations in frequency when the electrode finger width shifts back and forth are at a minimum. It is also understood from FIG. 6 that these characteristics have a similar tendency when the standardized film thickness or the Euler angles of the quartz substrate are changed.

Figure 7:
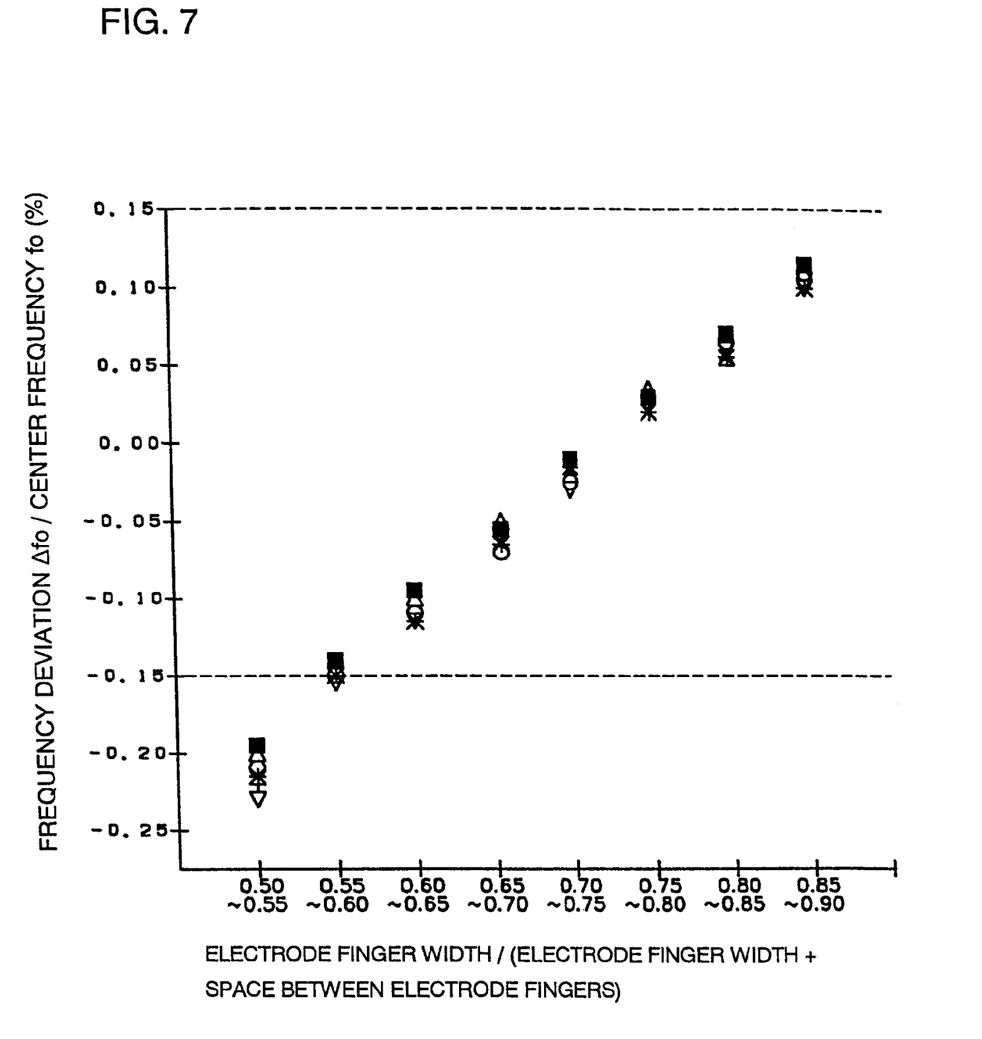
FIG. 7 is a graph showing frequency deviations relative to the ratio of the electrode finger width relative to the sum of the electrode finger width and the space between electrode fingers.

FIG. 7 is a graph showing the rate of change in the center frequency when the value for the ratio of the electrode finger width relative to the sum of the electrode finger width and the space between electrode fingers is shifted by about 0.05. That is, it is assumed that the value before the change for the ratio of the electrode finger width relative to the sum of the electrode finger width and the space between electrode fingers is "d1"; the value after the change for the ratio of the electrode finger width relative to the sum of the electrode finger width and the space between electrode fingers is "d2"; the center frequency before the change is "$f_o(d1)$"; and the center frequency after the change is "$f_o(d2)$", the values of "(d1+d2)/2" are plotted on the horizontal coordinate while the values of "$[f_o(d2)-f_o(d2)]/[(d1+d2)/2]/(d2-d1)$" are plotted on the vertical coordinate to constitute the graphical representation in FIG. 7. It is to be noted that the same symbols are used for the values of the normalized film thickness as those used in FIG. 6.

It is understood from FIG. 7 that the change in the center frequency is minimal when the value for the ratio of the electrode finger width relative to the sum of the electrode finger width and the space between electrode fingers is about 0.75. Since when the change in the center frequency is within approximately ±0.15%, variations in the electrode finger width due to manufacturing variations can be easily accommodated when they are within approximately ±1%, it is clear from FIG. 7 that the value for the ratio of the electrode finger width relative to the sum of the electrode finger width and the space between electrode fingers of not less than about 0.55 is acceptable. Further, it is more preferable that the value for the ratio of the electrode finger width relative to the sum of the electrode finger width and the space between electrode fingers is preferably in the range of from about 0.60 to about 0.85 as the value yields the change in the center frequency within approximately ±0.15%.

Figure 8:
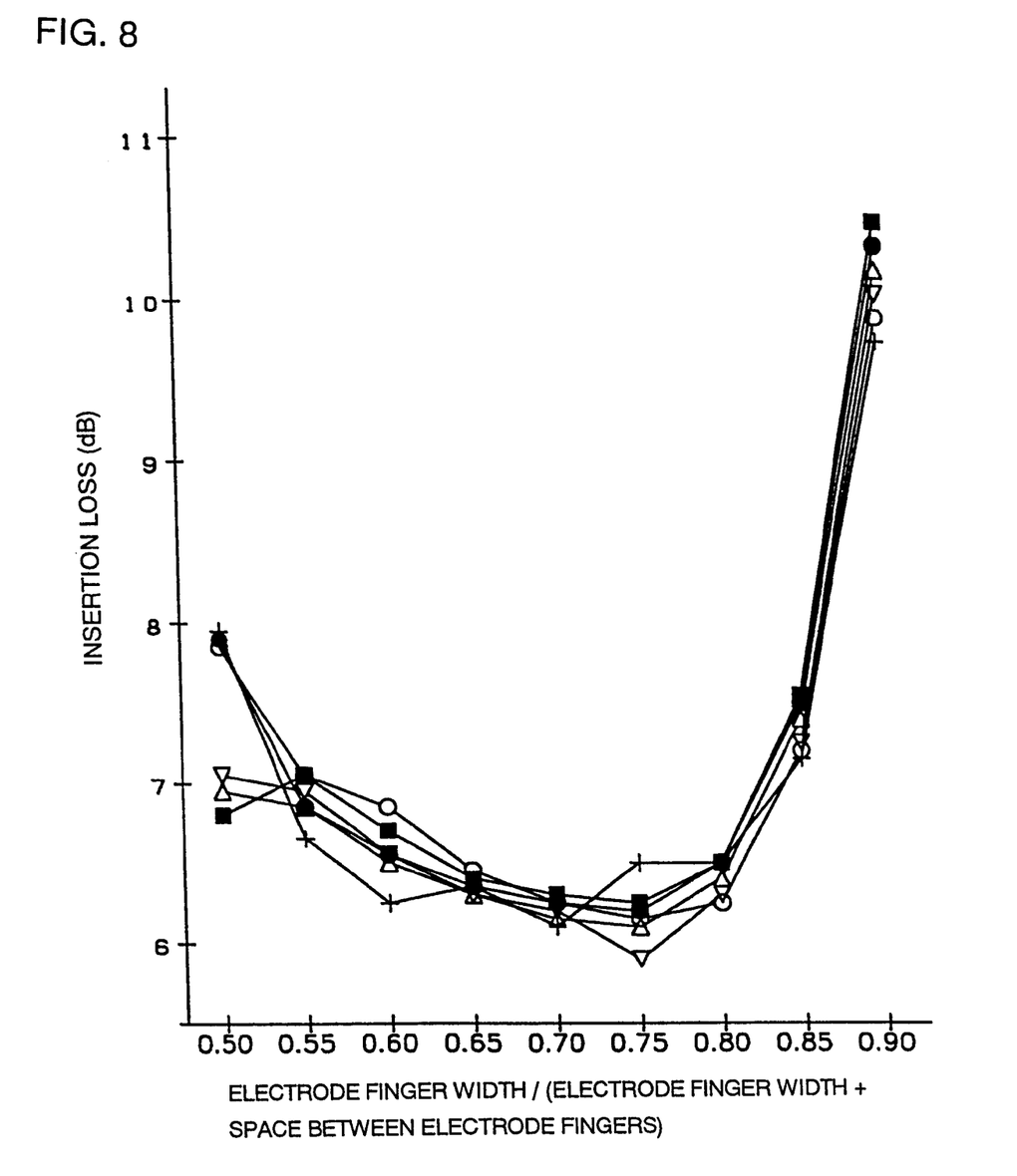
FIG. 8 is a graph showing insertion losses relative to the ratio of the electrode finger width relative to the sum of the electrode finger width and the space between electrode fingers.

FIG. 8 is a graph showing changes in the insertion loss of a filter corresponding to values of the ratio of the electrode finger width relative to the sum of the electrode finger width and the space between electrode fingers. It is to be noted that the same symbols are used for the values of the normalized film thickness as those used in FIG. 6. In addition, measurements were made after input/output impedance matching.

As shown in FIG. 8, it is understood that when the value of the ratio of the electrode finger width relative to the sum of the electrode finger width and the space between electrode fingers is about 0.75, the values of the insertion loss are minimal in the cases where the normalized thickness is about 2.0% to about 2.16%. The values of the insertion loss rise rapidly in the vicinity of the value of the ratio of the electrode finger width relative to the sum of the electrode finger width and the space between electrode fingers of over about 0.85 regardless of the standardized film thickness. Furthermore, as shown in FIG. 8, the minimal insertion loss at the value about 0.7 of the ratio of the electrode finger width relative to the sum of the electrode finger width and the space between electrode fingers in the case of the symbol "+" indicates that the minimal value point is slightly shifted by increasing of the standardized film thickness. It is clear from the above description and the graphs of FIG. 8 that in order to greatly improve insertion loss, a range of about 0.55 to about 0.85 is preferred and more specifically, a range of about 0.65 to about 0.8 is more preferable. Therefore, since this tendency is independent of the standardized film thickness, the insertion loss is scarcely affected by the mass load in the direction of the electrode film thickness. Accordingly, it is clear that the same tendency can be obtained when the IDT is formed of not just Ta but of a high-density metal having a higher specific weight than the piezoelectric material and a low speed of sound conductance such as W, Mo, Ni, Cu, Co, Cr, Zn, Fe, Mn, Au, Ag, Pt, Os, Ir, Hf, and alloys of these metals to excite SH-wave-type surface acoustic waves. When quartz is used, a similar effect can also be obtained when the Euler angles are within (0°, 121° to 136°, and 87° to 93°).

The above preferred embodiments have been described in the context of a one-stage surface acoustic wave filter. However, the present invention is limited to this, and multi-stage longitudinally connected or multi-stage parallel-connected filters may, of course, also be effective and be used.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A surface acoustic wave device comprising:
   a piezoelectric substrate made of a piezoelectric material; and
   at least one IDT including electrode fingers and disposed on said piezoelectric substrate, the at least one IDT being made of at least one of a metal and an alloy having a higher specific weight than that of the piezoelectric material of said piezoelectric substrate so as to excite Shear Horizontal (SH) waves;
   wherein a ratio of a width of at least one of the electrode fingers defining said IDT relative to a sum of the width of the at least one of the electrode fingers and a space between adjacent ones of the electrode fingers is from about 0.55 to about 0.85; and
   said piezoelectric substrate is a quartz substrate having Euler angles of approximately (0°, 121° to 136°, and 87° to 93°).

2. A surface acoustic wave resonator comprising:
   a piezoelectric substrate made of a piezoelectric material; and
   at least one IDT including electrode fingers and disposed on said piezoelectric substrate, the at least one IDT being made of at least one of a metal and an alloy having a higher specific weight than that of the piezoelectric material of said piezoelectric substrate so as to excite Shear Horizontal (SH) waves; wherein
   a ratio of a width of at least one of the electrode fingers defining said IDT relative to a sum of the width of the at least one of the electrode fingers and a space between adjacent ones of the electrode fingers is from about 0.55 to about 0.85; and
   said piezoelectric substrate is a quartz substrate having Euler angles of approximately (0°, 121° to 136°, and 87° to 93°).

3. A surface acoustic wave resonator according to claim 2, further comprising reflectors disposed on both sides of said at least one IDT so as to sandwich said at least one IDT therebetween.

4. A surface acoustic wave resonator according to claim 3, wherein the reflectors include a plurality of electrode fingers and a ratio of a width of one of the electrode fingers of the reflectors relative to the sum of the width of said one of the electrode fingers of the reflectors and a space between adjacent ones of the electrode fingers of the reflectors is from about 0.55 to about 0.85.

5. A surface acoustic wave resonator according to claim 2, wherein the piezoelectric substrate is made of crystal.

6. A surface acoustic wave resonator according to claim 2, wherein the at least one IDT is made of an electrode material containing Ta as the principal ingredient.

7. A surface acoustic wave resonator according to claim 2, further comprising at least two IDTs arranged substantially parallel to each other and separated by a predetermined space in the propagation direction of the surface acoustic wave.

8. A surface acoustic wave resonator according to claim 7, wherein the at least two IDTs are made of an electrode material containing Ta as the principal ingredient.

9. A surface acoustic wave resonator according to claim 7, wherein one of the at least two IDTs is arranged in a series line and the other of the at least two IDTs is arranged in a parallel line to define a ladder-type arrangement.

10. A surface acoustic wave resonator according to claim 2, wherein the surface acoustic wave resonator defines a longitudinally-coupled type surface acoustic wave filter.

11. A surface acoustic wave resonator according to claim 2, wherein the surface acoustic wave resonator defines a laterally-coupled type surface acoustic wave filter.

12. A surface acoustic wave resonator according to claim 2, wherein the surface acoustic wave resonator defines a ladder type filter.

13. A communication device comprising:
   a surface acoustic wave device including:
      a piezoelectric substrate made of a piezoelectric material; and
      at least one IDT including electrode fingers and disposed on said piezoelectric substrate, the at least one IDT being made of at least one of a metal and an alloy having a higher specific weight than that of the piezoelectric material of said piezoelectric substrate so as to excite Shear Horizontal (SH) waves;
   wherein a ratio of a width of at least one of the electrode fingers defining said IDT relative to a sum of the width of the at least one of the electrode fingers and a space between adjacent ones of the electrode fingers is from about 0.55 to about 0.85; and
   said piezoelectric substrate is a quartz substrate having Euler angles of approximately (0°, 121° to 136°, and 87° to 93°).

14. A communication device according to claim 13, wherein the at least one IDT is made of an electrode material containing Ta as the principal ingredient.

15. A communication device according to claim 13, further comprising at least two IDTs arranged substantially parallel to each other and separated by a predetermined space in the propagation direction of the surface acoustic wave.

16. A communication device according to claim 13, further comprising reflectors disposed on both sides of said at least one IDT so as to sandwich said at least one IDT therebetween.

17. A communication device according to claim 16, wherein the reflectors include a plurality of electrode fingers and a ratio of a width of one of the electrode fingers of the reflectors relative to the sum of the width of said one of the electrode fingers of the reflectors and a space between adjacent ones of the electrode fingers of the reflectors is from about 0.55 to about 0.85.

18. A communication device according to claim 13, wherein the piezoelectric substrate is made of crystal.

\* \* \* \* \*